(12) United States Patent
Takei (10) Patent No.: US 12,354,856 B2
(45) Date of Patent: Jul. 8, 2025

(54) FILM FORMING APPARATUS

(71) Applicant: TOKYO ELECTRON LIMITED, Tokyo (JP)

(72) Inventor: Junichi Takei, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 18/329,384

(22) Filed: Jun. 5, 2023

(65) Prior Publication Data

US 2023/0411131 A1  Dec. 21, 2023

(30) Foreign Application Priority Data

Jun. 16, 2022  (JP) ................................. 2022-097389

(51) Int. Cl.
*H01J 37/34* (2006.01)
*C23C 14/34* (2006.01)
*C23C 14/54* (2006.01)

(52) U.S. Cl.
CPC .......... *H01J 37/3441* (2013.01); *C23C 14/34* (2013.01); *C23C 14/54* (2013.01); *H01J 2237/332* (2013.01)

(58) Field of Classification Search
CPC ............. H01J 37/3441; H01J 2237/332; H01J 37/32477; H01J 37/3447; C23C 14/34; C23C 14/54; C23C 14/564
See application file for complete search history.

(56) References Cited

U.S. PATENT DOCUMENTS

| | | | | |
|---|---|---|---|---|
| 6,287,986 B1 * | 9/2001 | Mihara | ................ | H01J 37/3438 438/758 |
| 2005/0039679 A1 * | 2/2005 | Kleshock | .............. | C23C 14/564 118/715 |
| 2009/0272647 A1 * | 11/2009 | Young | ................ | H01J 37/32082 204/298.11 |
| 2011/0089023 A1 * | 4/2011 | Tanaka | .................. | C23C 14/564 204/192.12 |
| 2011/0209989 A1 * | 9/2011 | Li | ........................... | C23C 14/34 204/298.15 |
| 2014/0305802 A1 * | 10/2014 | Ding | ..................... | C23C 14/046 204/298.16 |
| 2019/0108988 A1 * | 4/2019 | Koch | ................ | H01J 37/32477 |

FOREIGN PATENT DOCUMENTS

JP  2021-175815 A  11/2021

* cited by examiner

*Primary Examiner* — James Lin
*Assistant Examiner* — Patrick S Ott
(74) *Attorney, Agent, or Firm* — Fenwick & West LLP (57) ABSTRACT

There is provided a film forming apparatus comprising a processing chamber including a processing chamber main body and a lid, a stage, a target, and a shield. The shield has a chamber shield fixed to the processing chamber main body and a target shield fixed to the lid. The chamber shield has a cylindrical sidewall and a horizontal wall formed at a radially outer side of the cylindrical sidewall. The target shield has a cylindrical portion extending toward the stage. A diameter of an outer peripheral surface of the cylindrical portion is smaller than a diameter of an inner peripheral surface of the cylindrical sidewall, and the cylindrical portion and the cylindrical sidewall form a double pipe structure in which the cylindrical portion and the cylindrical sidewall overlap at least partially in a height direction.

7 Claims, 7 Drawing Sheets

FILM FORMING APPARATUS

CROSS-REFERENCE TO RELATED APPLICATIONS

This application claims priority to Japanese Patent Application No. 2022-097389, filed on Jun. 16, 2022, the entire contents of which are incorporated herein by reference.

TECHNICAL FIELD

The present disclosure relates to a film forming apparatus.

BACKGROUND

Patent Document 1 discloses a film forming apparatus for forming a metal oxide film on a substrate. The film forming apparatus includes a processing chamber whose inner pressure can be reduced, a shield part disposed in the processing chamber to define a processing space, a substrate support disposed in the processing chamber and on which a substrate is placed to face a processing space, and a holder for holding a target that emits sputtered particles into the processing space.

PRIOR ART DOCUMENTS

Patent Documents

Patent Document 1: Japanese Laid-open Patent Publication No. 2021-175815

SUMMARY

In one aspect, the present disclosure provides a film forming apparatus for suppressing generation of particles.

According to one embodiment, there is provided a film forming apparatus comprises: a processing chamber including a processing chamber main body having an upper opening and a lid that closes the upper opening; a stage disposed in the processing chamber and on which a substrate is placed; a target disposed in the processing chamber to emit sputtered particles; and a shield that defines a processing space where the sputtered particles are emitted into the processing chamber, wherein the shield has a chamber shield fixed to the processing chamber main body and a target shield fixed to the lid, the chamber shield has a cylindrical sidewall and a horizontal wall formed at a radially outer side of the cylindrical sidewall, the target shield has a cylindrical portion extending toward the stage, and a diameter of an outer peripheral surface of the cylindrical portion is smaller than a diameter of an inner peripheral surface of the cylindrical sidewall, and the cylindrical portion and the cylindrical sidewall form a double pipe structure in which the cylindrical portion and the cylindrical sidewall overlap at least partially in a height direction.

BRIEF DESCRIPTION OF THE DRAWINGS

The objects and features of the present disclosure will become apparent from the following description of embodiments, given in conjunction with the accompanying drawings, in which.

DETAILED DESCRIPTION

Hereinafter, embodiments of the present disclosure will be described in detail with reference to the accompanying drawings. Like reference numerals will be given to like parts throughout the drawings, and redundant description may be omitted.

Figure 1:
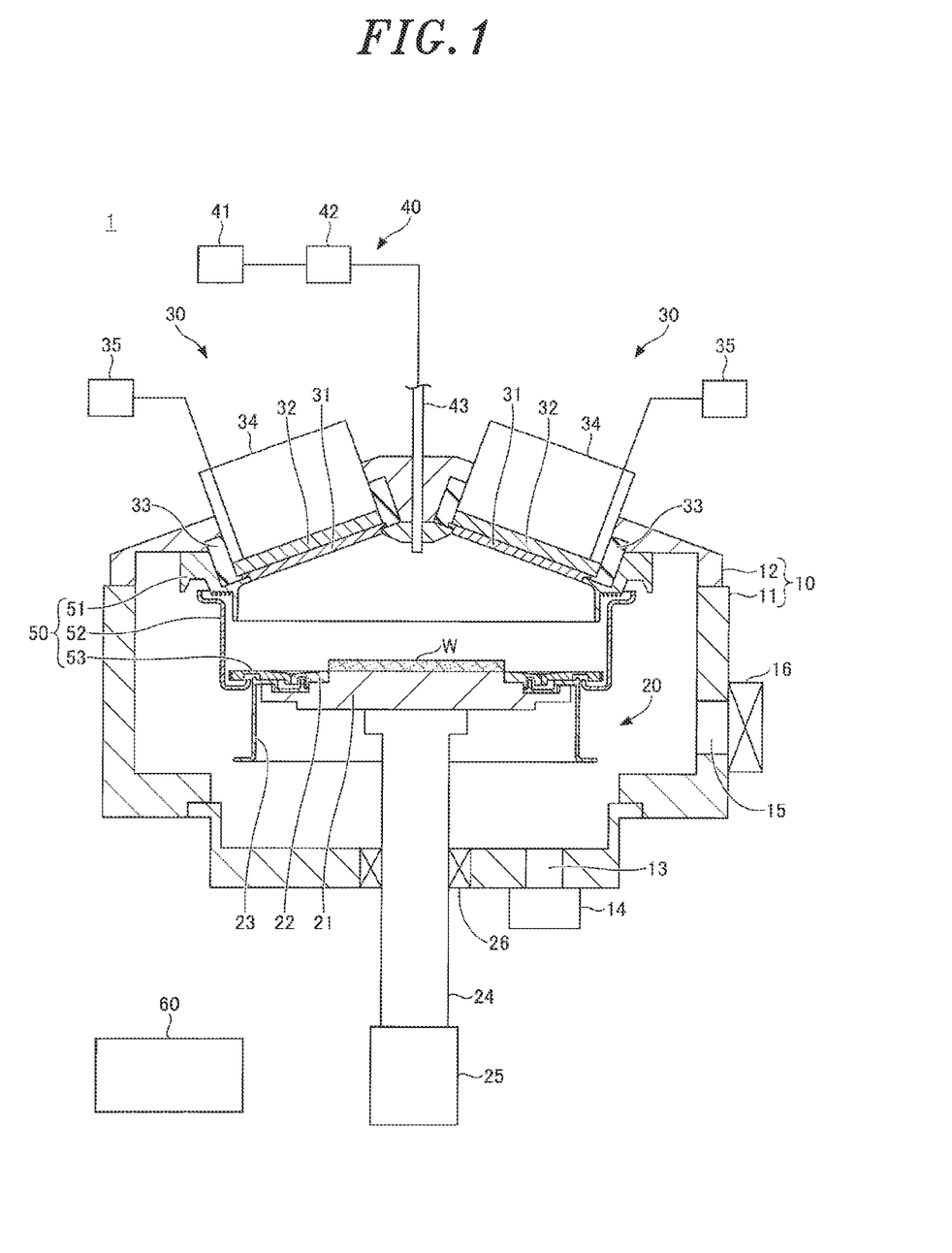
FIG. 1 is an example of a cross-sectional view explaining a configuration of a film forming apparatus.
Figure 2:
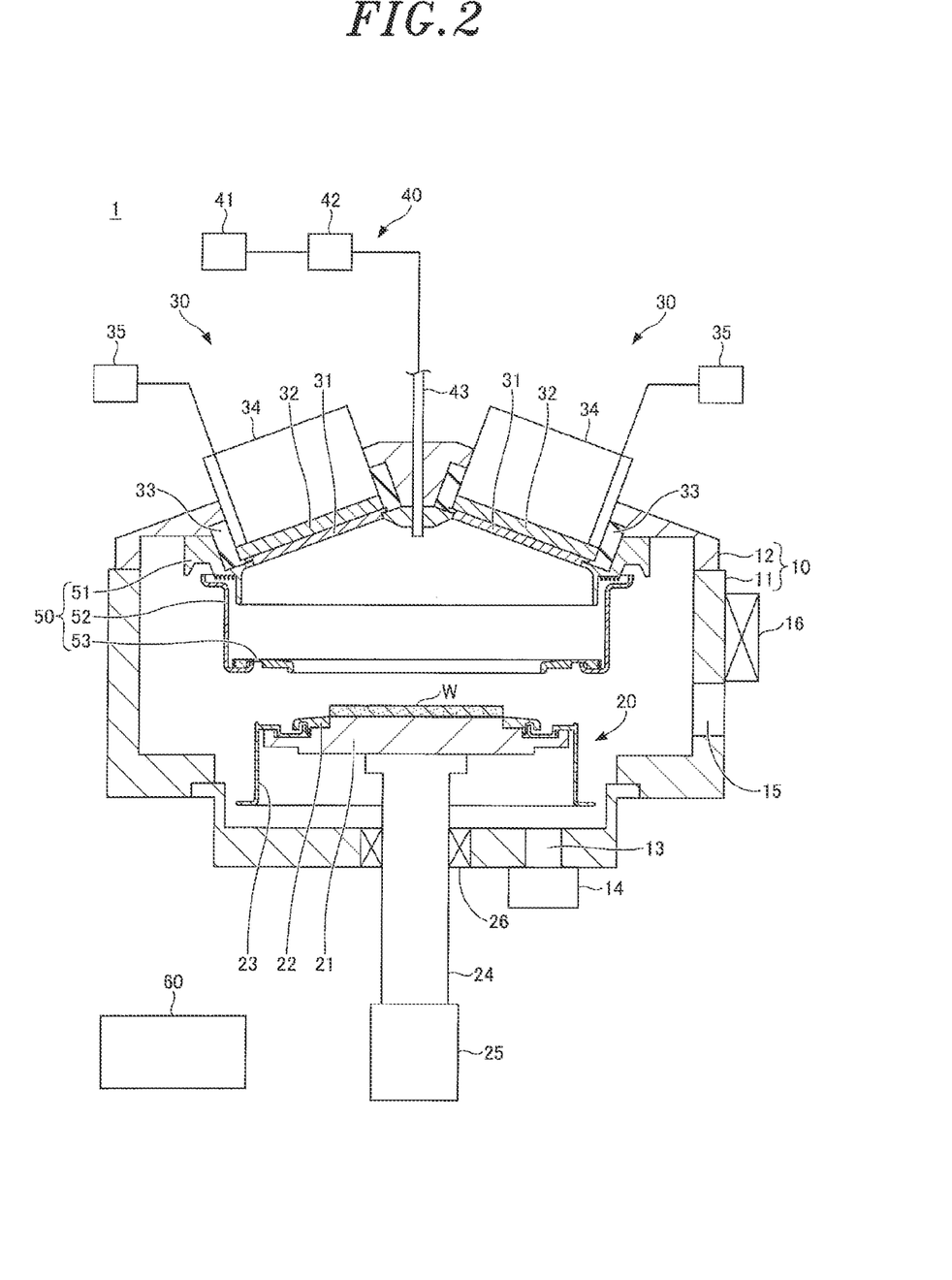
FIG. 2 is an example of a cross-sectional view explaining the configuration of a film forming apparatus.

A film forming apparatus (substrate processing apparatus or sputtering apparatus) 1 will be described with reference to FIGS. 1 and 2. FIGS. 1 and 2 are examples of cross-sectional views explaining a configuration of the film forming apparatus 1. FIG. 1 shows a state in which a stage 21 is located at a processing position when the substrate W is subjected to film formation. FIG. 2 shows a state in which the stage 21 is located at a transfer position when the substrate W is transferred.

The film forming apparatus 1 includes a processing chamber 10, a substrate holding part 20, a sputtered particle emitting part 30, a gas supply part 40, a shield 50, and a controller 60. The film forming apparatus 1, which is a physical vapor deposition (PVD) apparatus, for example, is a sputtering apparatus for forming a film by depositing sputtered particles (film forming atoms) emitted from the sputtered particle emitting part 30 onto a surface of a substrate W, such as a semiconductor wafer or the like, held by the substrate holding part 20 in the processing chamber 10.

The processing chamber 10 includes a processing chamber main body 11 made of, for example, a metal material such as aluminum or the like, and having an upper opening, and a lid 12 disposed to close the upper opening of the processing chamber main body 11. The lid 12 has a substantially truncated cone shape. Further, the lid 12 is detachable from the processing chamber main body 11.

An exhaust port 13 is formed at a bottom portion of the processing chamber 10. An exhaust device 14 is connected to the exhaust port 13. The exhaust device 14 includes a pressure control valve and a vacuum pump. The inner space of the processing chamber 10 is evacuated to a predetermined vacuum level by the exhaust device 14.

A transfer port 15 through which the substrate W is loaded into and unloaded from the processing chamber 10 is formed at a sidewall of the processing chamber 10. The transfer port 15 is opened and closed by a gate valve 16.

The substrate holding part 20 includes a stage 21, an annular member 22, a stage cover 23, a support 24, a driving device 25, and a vacuum sealing mechanism 26.

The stage 21 is formed in a substantially disc shape, and has a substrate supporting surface on which the substrate W is horizontally placed. The stage 21 further includes a base. The base is made of a metal material such as aluminum or the like. An electrostatic chuck may be disposed on the upper surface of the base. The electrostatic chuck has a dielectric and an electrode disposed in the dielectric. Further, the electrostatic chuck has a substrate supporting surface on an upper surface thereof. By applying a voltage from a power source for the electrostatic chuck to the electrode, the substrate W placed on the substrate supporting surface is electrostatically attracted. In addition, a temperature control mechanism such as a heater or the like may be disposed in the stage 21.

The annular member 22 is fixed to the upper surface of the stage 21 to surround the substrate supporting surface. The annular member 22 is made of a material such as stainless steel or the like.

A substantially cylindrical stage cover 23 is fixed to the side surface of the stage 21. The stage cover 23 is made of a material such as aluminum or the like.

The support 24 penetrates through the bottom wall of the processing chamber 10. One end of the support 24 is fixed to the center of the bottom surface of the stage 21 disposed in the processing chamber 10, and the other end thereof is connected to a driving device 25 disposed outside the processing chamber 10. Between the bottom wall of the processing chamber 10 and the support 24, there is provided the vacuum sealing mechanism 26 that allows the support 24 to rotate and be inserted into and removed from, while also performing vacuum sealing the inside of the processing chamber 10.

The driving device 25 is configured to drive the support 24 in a vertical direction (insertion/removal direction) and rotate the support 24.

The driving device 25 can move the stage 21 to the transfer position (see FIG. 2) by moving the support 24 downward.

The driving device 25 can move the stage 21 to the processing position (see FIG. 1) by moving the support 24 upward. Here, a mask shield 53 to be described later is placed on the stage 21 by raising the stage 21 to the processing position. Further, by moving the stage 21 to the processing position, a processing space where sputtered particles are emitted is formed by the stage 21, the annular member 22, and the shield 50.

The driving device 25 rotates the support 24 in a state where the stage 21 is located at the processing position, so that the stage 21, the annular member 22, the stage cover 23, and the mask shield 53 to be described later are rotated.

The sputtered particle emitting part 30 includes a target 31, a target holder 32, an insulator 33, a magnet device 34, and a power supply 35. The sputtered particle emitting part 30 is disposed on the inclined surface of the lid 12 of the processing chamber 10. In the example shown in FIGS. 1 and 2, two sputtered particle emitting parts 30 are illustrated. However, the present disclosure is not limited thereto. For example, one sputtered particle emitting part 30 may be provided, or a plurality of sputtered particle emitting parts 30 may be arranged on the circumference centering on the rotation axis of the support 24.

The target 31 is made of a material containing constituent elements of a film to be formed. The target 31 may be made of a conductive material or a dielectric material. The target 31 has a substantially rectangular planar shape. When a plurality of sputtered particle emitting parts 30 are provided, the targets 31 may be made of the same material or may be made of different materials. Further, the target 31 is disposed to face the substrate supporting surface of the stage 21 (the surface of the substrate W placed on the substrate supporting surface).

The target holder 32 is made of a conductive material and holds the target 31. The target holder 32 is supported by the lid 12 via the insulator 33.

When the target 31 is sputtered, the power supply 35 applies a negative voltage, for example, to the target holder 32. Accordingly, ions in a sputtering gas dissociated near the target 31 collide with the target 31, and the sputtered particles are emitted from the target 31.

The magnet device 34 includes a magnet disposed on the rear side of the target holder 32, and a magnet driving mechanism for reciprocating the magnet. Due to the magnetic field of the magnet, the position where the ions in the sputtering gas collide with the target 31 is changed.

The gas supply part 40 includes a gas supply source 41, a mass flow controller 42, and a gas supply line 43. The gas supply source 41 supplies a sputtering gas (inert gas) for plasma generation, for example, Ar gas. Further, the gas supply source 41 may supply a reaction gas (for example, an oxidizing gas, a nitriding gas, or the like) that reacts with the sputtered particles. The mass flow controller 42 controls a flow rate of a gas supplied into the processing chamber 10. The gas supply line 43 supplies a gas to the processing space (the space formed by the stage 21 located at the processing position, the annular member 22, and the shield 50) in the processing chamber 10.

The shield 50 includes a target shield 51, a chamber shield 52, and a mask shield 53.

The target shield 51 has an opening through which the target 31 is exposed, and is fixed to the bottom surface of the lid 12. That is, when the lid 12 is removed from the processing chamber main body 11, the target shield 51 is removed from the processing chamber main body 11 together with the lid 12. The target shield 51 is made of a material such as aluminum or the like.

The chamber shield 52 is formed in a substantially cylindrical shape and is fixed in the processing chamber main body 11. That is, when the lid 12 is removed from the processing chamber main body 11, the chamber shield 52 is positioned in the processing chamber main body 11. The chamber shield 52 is made of a material such as aluminum or the like.

The mask shield 53 has a substantially annular shape. The mask shield 53 is made of a material such as stainless steel or the like. Here, when the stage 21 is moved to the processing position (see FIG. 1), the mask shield 53 is placed on the stage 21. When the stage 21 is rotated by the driving device 25, the mask shield 53 is rotated together with the stage 21. Further, when the stage 21 is moved to the transfer position (see FIG. 2), the mask shield 53 is restrained by a supporting member (not shown), and its downward movement is restricted. Accordingly, the mask shield 53 is separated from the stage 21.

The controller 60 is a computer, and controls individual components of the film forming apparatus 1, such as the exhaust device 14, the gate valve 16, the power source for the electrostatic chuck, the driving device 25, the magnet device 34, the power supply 35, the gas supply source 41, the mass flow controller 42, and the like. The controller 60 includes a main controller that is a central processing unit (CPU) for actually controlling the above components, an input device, an output device, a display device, and a storage device. The storage device stores parameters of various processes executed in the film forming apparatus 1.

A storage medium that stores a program, i.e., a processing recipe, for controlling the processes executed in the film forming apparatus 1 is set in the storage device. The main controller of the controller 60 reads out a predetermined processing recipe stored in the storage medium, and causes the film forming apparatus 1 to execute predetermined processing based on the processing recipe.

Next, an example of the operation of the film forming apparatus 1 will be described. The processing chamber 10 is evacuated to a predetermined vacuum level by the exhaust device 14.

First, the controller 60 controls the driving device 25 to lower the stage 21 to the transfer position (see FIG. 2), and controls the gate valve 16 to be opened. Accordingly, the transfer device (not shown) loads the substrate W into the processing chamber 10 through the transfer port 15 and places the substrate W on the substrate supporting surface of the stage 21. When the stage 21 is provided with an electrostatic chuck, the controller 60 controls the power source for the electrostatic chuck and applies a voltage to the electrode of the electrostatic chuck to electrostatically attract the substrate W on the substrate supporting surface of the stage 21. When the transfer device retracts from the transfer port 15, the controller 60 controls the gate valve 16 to be closed.

Next, the controller 60 controls the driving device 25 to raise the stage 21 to the processing position (see FIG. 1). Accordingly, the mask shield 53 supported by the supporting member (not shown) in the chamber shield 52 is lifted by the stage 21 and placed on the stage 21. Further, by raising the stage 21 to the processing position, the processing space having a top portion defined by the target shield 51, a side surface defined by the chamber shield 52, and a bottom portion defined by the mask shield 53, the annular member 22, and the substrate supporting surface of the stage 21 is formed.

Next, the controller 60 controls the driving device 25 to rotate the support 24. Accordingly, the substrate W, the stage 21, the annular member 22, the stage cover 23, and the mask shield 53 are rotated. Further, the controller 60 controls the gas supply source 41 and the mass flow controller 42 to supply a sputtering gas (e.g., Ar gas) for plasma generation into the processing space. Further, the controller 60 controls the power supply 35 to apply a negative voltage to the target holder 32. Therefore, ions in the sputtering gas dissociated around the target 31 collide with the target 31, and sputtered particles are emitted from the target 31 into the processing space. Accordingly, the sputtered particles are adhered to the substrate W, and a film is formed on the substrate W. By reciprocating the magnet of the magnet device 34, uneven consumption of the target 31 is suppressed.

Here, a gap exists between the target shield 51 fixed to the lid 12 and the chamber shield 52 fixed to the processing chamber main body 11. The gas in the processing space passes through the gap between the target shield 51 and the chamber shield 52, and is exhausted to the space in the processing chamber 10 that is located outside the processing space. Then, the gas is exhausted to the outside of the processing chamber 10 through the exhaust port 13 by the exhaust device 14. Further, a labyrinth structure to be described later is provided in the gas channel formed by the gap between the target shield 51 and the chamber shield 52, so that the sputtered particles are prevented from scattering from the inside of the processing space surrounded by the shield 50 into the processing chamber 10 located outside the processing space.

Further, a gap exists between the mask shield 53 and the stage cover 23 rotating together with the stage 21 and the chamber shield 52 fixed to the processing chamber main body 11. The gas in the processing space passes through the gap between the chamber shield 52 and the mask shield 53 and the gap between the chamber shield 52 and the stage cover 23, and is exhausted to the space in the processing chamber 10 that is located outside the processing space. Then, the gas is exhausted to the outside of the processing chamber 10 through the exhaust port 13 by the exhaust device 14. Further, a labyrinth structure to be described later is provided in the gas channel formed by the gap between the chamber shield 52 and the mask shield 53 and the gap between the chamber shield 52 and the stage cover 23, so that the sputtered particles are prevented from scattering from the inside of the processing space surrounded by the shield 50 into the processing chamber 10 located outside the processing space.

When the film formation is completed, the controller 60 controls the gas supply source 41 and the mass flow controller 42 to stop the supply of the sputtering gas. Further, the controller 60 controls the power supply 35 to stop the application of the voltage to the target holder 32. Moreover, the controller 60 controls the driving device 25 to stop the rotation of the support 24.

Next, the controller 60 controls the driving device 25 to lower the stage 21 to the transfer position (see FIG. 2). Accordingly, the mask shield 53 is restrained by a supporting member (not shown), and its downward movement is restricted. The mask shield 53 is supported by the supporting member (not shown) in the chamber shield 52.

When the stage 21 is provided with an electrostatic chuck, the controller 60 controls the power source for the electrostatic chuck to stop the application of the voltage to the electrode of the electrostatic chuck, thereby releasing the electrostatic attraction. Further, the controller 60 controls the gate valve 16 to be opened. Accordingly, the transfer device (not shown) receives the substrate W placed on the substrate supporting surface of the stage 21 and unloads the substrate from the processing chamber 10 through the transfer port 15. When the transfer device retracts from the transfer port 15, the controller 60 controls the gate valve 16 to be closed.

As described above, in the film forming apparatus 1, the sputtered particles are emitted from the target 31 and adhered to the surface of the substrate W, thereby forming a film. Further, in the film forming apparatus 1, the sputtered particles are prevented from scattering from the inside of the processing space surrounded by the shield 50 into the processing chamber 10 located outside the processing space.

Figure 3:
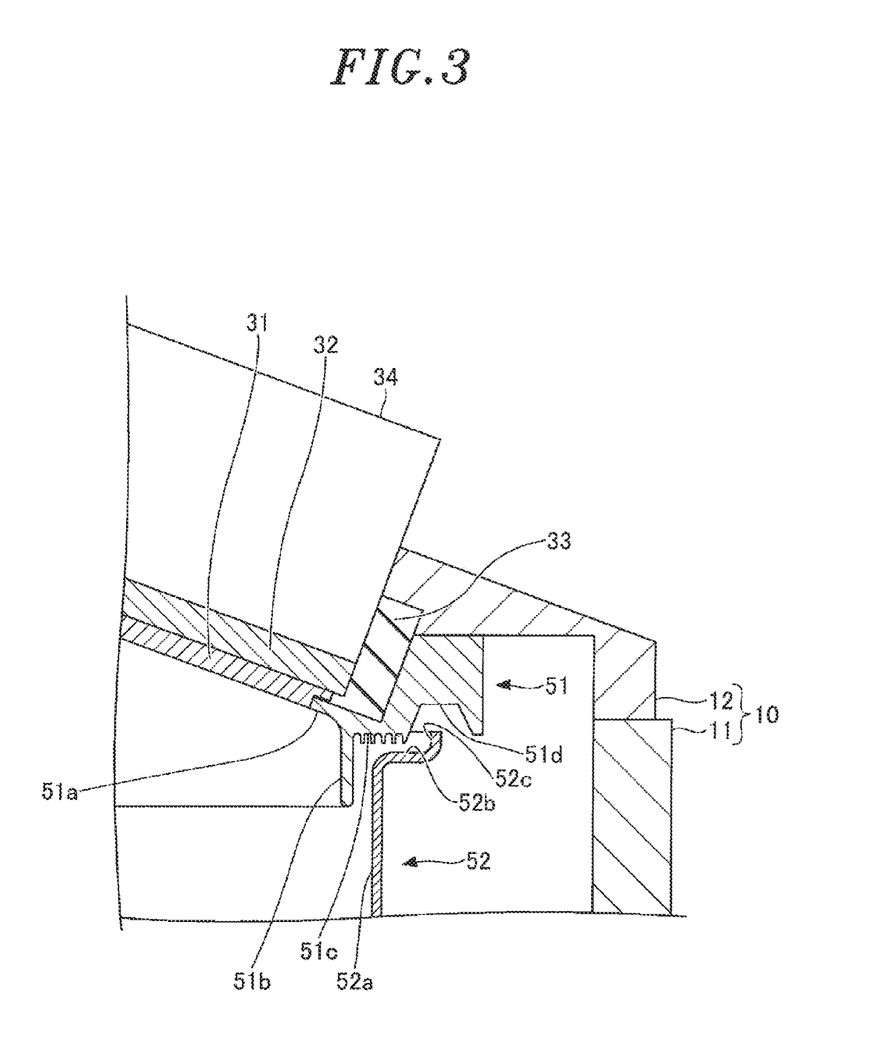
FIG. 3 is an example of a partially enlarged cross-sectional view of the film forming apparatus.
Figure 4:
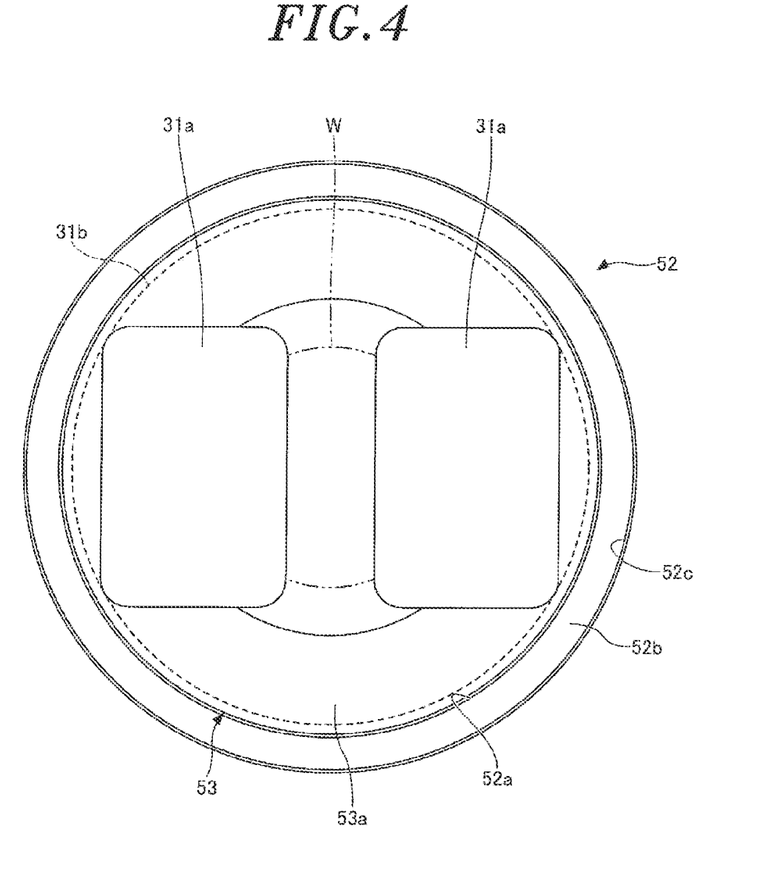
FIG. 4 is an example of a plan view showing the positional relationship between a sputtered particle emitting surface of a target and a chamber shield in the film forming apparatus.
Figure 5:
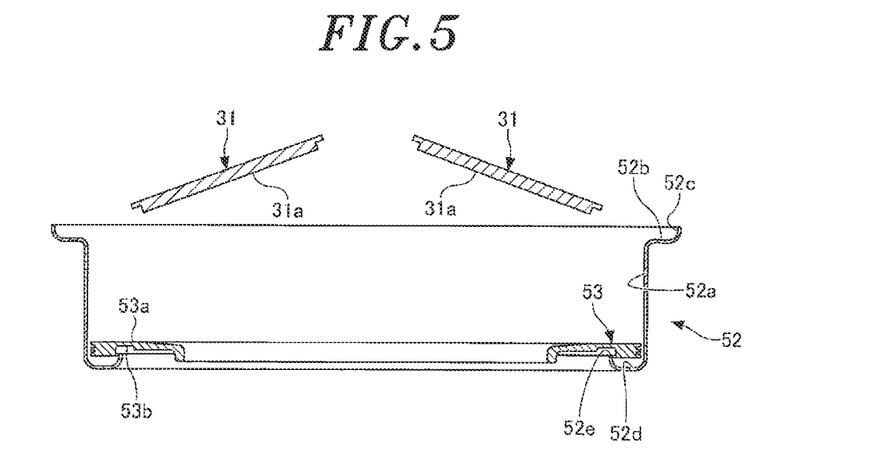
FIG. 5 is an example of a cross-sectional view showing the positional relationship of the target, the chamber shield, and a mask shield in the film forming apparatus.

Next, the structure of the shield 50 will be further described with reference to FIGS. 3 to 5. FIG. 3 is an example of a partially enlarged cross-sectional view of the film forming apparatus 1. FIG. 4 is an example of a plan view showing the positional relationship between a sputtered particle emitting surface 31a of the target 31 and the chamber shield 52 in the film forming apparatus 1. FIG. 5 is an example of a cross-sectional view showing the positional relationship of the target 31, the chamber shield 52, and the mask shield 53 in the film forming apparatus 1.

As shown in FIG. 3, the chamber shield 52 has a cylindrical sidewall 52a, a horizontal wall 52b, and a raised portion 52c.

The cylindrical sidewall 52a is formed in a cylindrical shape having a central axis perpendicular to the substrate supporting surface of the stage 21. The inner peripheral surface of the cylindrical sidewall 52a is a surface (upright surface) perpendicular to the substrate supporting surface of the stage 21. In other words, the inner peripheral surface of the cylindrical sidewall 52a is substantially perpendicular to the target 31 disposed to face the substrate supporting surface of the stage 21. Further, the cylindrical sidewall 52a defines the side surface of the processing space. The diameter of the inner peripheral surface of the cylindrical sidewall 52a is greater than the diameter of the outer peripheral surface of the mask shield 53.

The horizontal wall 52b is formed in an annular shape extending horizontally and radially outward from the upper portion (or upper end) of the cylindrical sidewall 52a. The upper surface of the horizontal wall 52b is a surface (horizontal surface) parallel to the substrate supporting surface of the stage 21. In other words, the upper surface of the horizontal wall 52b is disposed to face the target 31.

The raised portion 52c is formed in a cylindrical shape extending upward (toward the target shield 51 from the radially outer side (or the outer peripheral end) of the horizontal wall 52b and having a central axis perpendicular to the substrate supporting surface of the stage 21.

The target shield 51 has a bottom surface portion 51a, a cylindrical portion 51b, a trap structure portion 51c, and a groove 51d.

The bottom surface portion 51a has an opening exposing the target 31 and is formed to cover the bottom surface of the lid 12 including the periphery of the target 31.

The cylindrical portion 51b is formed in a cylindrical shape extending downward (toward the stage 21) from the bottom surface portion 51a and having a central axis perpendicular to the substrate supporting surface of the stage 21. Here, the cylindrical portion 51b is disposed at an inner side of the cylindrical sidewall 52a. In other words, the diameter of the outer peripheral surface of the cylindrical portion 51b is smaller than the diameter of the inner peripheral surface of the cylindrical sidewall 52a. Further, the lower end of the cylindrical portion 51b is lower than the upper surface of the horizontal wall 52b. That is, the cylindrical portion 51b and the cylindrical sidewall 52a overlap at least partially in the height direction. In other words, the cylindrical portion 51b and the cylindrical sidewall 52a form a double pipe structure in which they overlap at least partially in the height direction. Accordingly, the horizontal wall 52b is hidden by the cylindrical portion 51b when viewed from the target 31.

The trap structure portion (sputtered particle incidence suppression structure portion) 51c is formed at a radially outer side of the cylindrical portion 51b. Further, at least a part of the trap structure portion 51c faces the horizontal wall 52b. Here, the sputtered particles in the processing space are reflected from the surface of the substrate W or collide with other sputtered particles or an inert gas, and then pass through the gap between the cylindrical portion 51b and the cylindrical sidewall 52a. Next, the sputtered particles are incident on the trap structure portion 51c. The trap structure portion 51c has a structure for capturing (trapping) the sputtered particles incident on the trap structure portion 51c. For example, the trap structure portion 51c may be an uneven structure or an uneven surface where irregularities are formed. Further, the trap structure portion 51c may be a blasted surface. Accordingly, it is possible to suppress the sputtered particles that are incident on the trap structure portion 51c while passing through the gap between the cylindrical portion 51b and the cylindrical sidewall 52a from being reflected from the trap structure portion 51c and being incident on the horizontal wall 52b. Hence, it is possible to suppress the deposition of deposits by the sputtered particles on the horizontal wall 52b. In other words, the trap structure portion 51c constitutes a sputtered particle incidence suppression structure portion for suppressing the incidence of the sputtered particles on the horizontal wall 52b.

Further, the sputtered particle incidence suppression structure portion is not limited to the trap structure portion. The sputtered particle incidence suppression structure portion formed at a radially outer side of the cylindrical portion 51b may be an inclined surface. The inclined surface is a surface whose normal direction is directed toward a radially inner side. That is, the inclined surface is a surface in which a radially inner side is higher than a radially outer side. Accordingly, it is possible to suppress the sputtered particles incident on the inclined surface while passing through the gap between the cylindrical portion 51b and the cylindrical sidewall 52a from rebounding toward the horizontal wall 52b. Hence, it is possible to suppress the deposition of deposits by the sputtered particles on the horizontal wall 52b.

The sputtered particle incidence suppression structure portion may have an inclined surface and a trap structure. Further, the sputtered particle incidence suppression structure portion may have a thermally sprayed film (e.g., a thermally sprayed film containing yttria) that suppresses peeling off of a film.

The groove 51d is formed at a radially outer side of the trap structure portion 51c. When the lid 12 is attached to the processing chamber main body 11, the raised portion 52c is inserted into the groove 51d. Accordingly, a labyrinth structure is formed in the gas channel formed by the gap between the target shield 51 and the chamber shield 52.

As shown in FIGS. 3 and 4, the target 31 has a sputtered particle emitting surface 31a exposed to the processing space through the opening of the bottom surface portion 51a. The sputtered particle emitting surface 31a of the target 31 is disposed at an inner side of the cylindrical portion 51b. That is, the sputtered particle emitting surface 31a (the opening of the bottom surface portion 51a) of the target 31 is disposed at an inner side of the inner peripheral surface of the cylindrical portion 51b. In other words, in plan view, the diameter of the inner peripheral surface of the cylindrical portion 51b is greater than the diameter of a circumcircle 31b of the sputtered particle emitting surface 31a of the target 31.

Further, the sputtered particle emitting surface 31a of the target 31 is disposed at an inner side of the cylindrical sidewall 52a of the chamber shield 52. In other words, in plan view, the diameter of the inner peripheral surface of the cylindrical sidewall 52a is greater than the diameter of the circumcircle 31b of the sputtered particle emitting surface 31a of the target 31. Further, in other words, in plan view, the target 31 is disposed at a position where the diameter of the circumcircle 31b of the sputtered particle emitting surface 31a of the target 31 and the horizontal wall 52b do not overlap. That is, as shown in FIG. 4, in plan view, the target 31 is disposed at a position where the sputtered particle emitting surface 31a of the target 31 does not overlap the horizontal wall 52b.

Further, as shown in FIG. 5, the chamber shield 52 has a lower horizontal wall 52d and a lower raised portion 52e.

The lower horizontal wall 52d is formed in an annular shape horizontally extending radially inward from the lower side of the cylindrical sidewall 52a.

The lower raised portion 52e is formed in a cylindrical shape extending upward from the radially inner side of the horizontal wall 52b and having a central axis perpendicular to the substrate supporting surface of the stage 21.

As shown in FIG. 5, the mask shield 53 has an upper surface 53a exposed to the processing space. Further, a lower groove 53b is formed on the bottom surface side of the mask shield 53. When the stage 21 is located at the processing position (see FIG. 1), the lower raised portion 52e is inserted into the lower groove 53b. Accordingly, a labyrinth structure is formed in the gas channel formed by the gap between the chamber shield 52 and the mask shield 53 and the gap between the chamber shield 52 and the stage cover 23.

Figure 6:
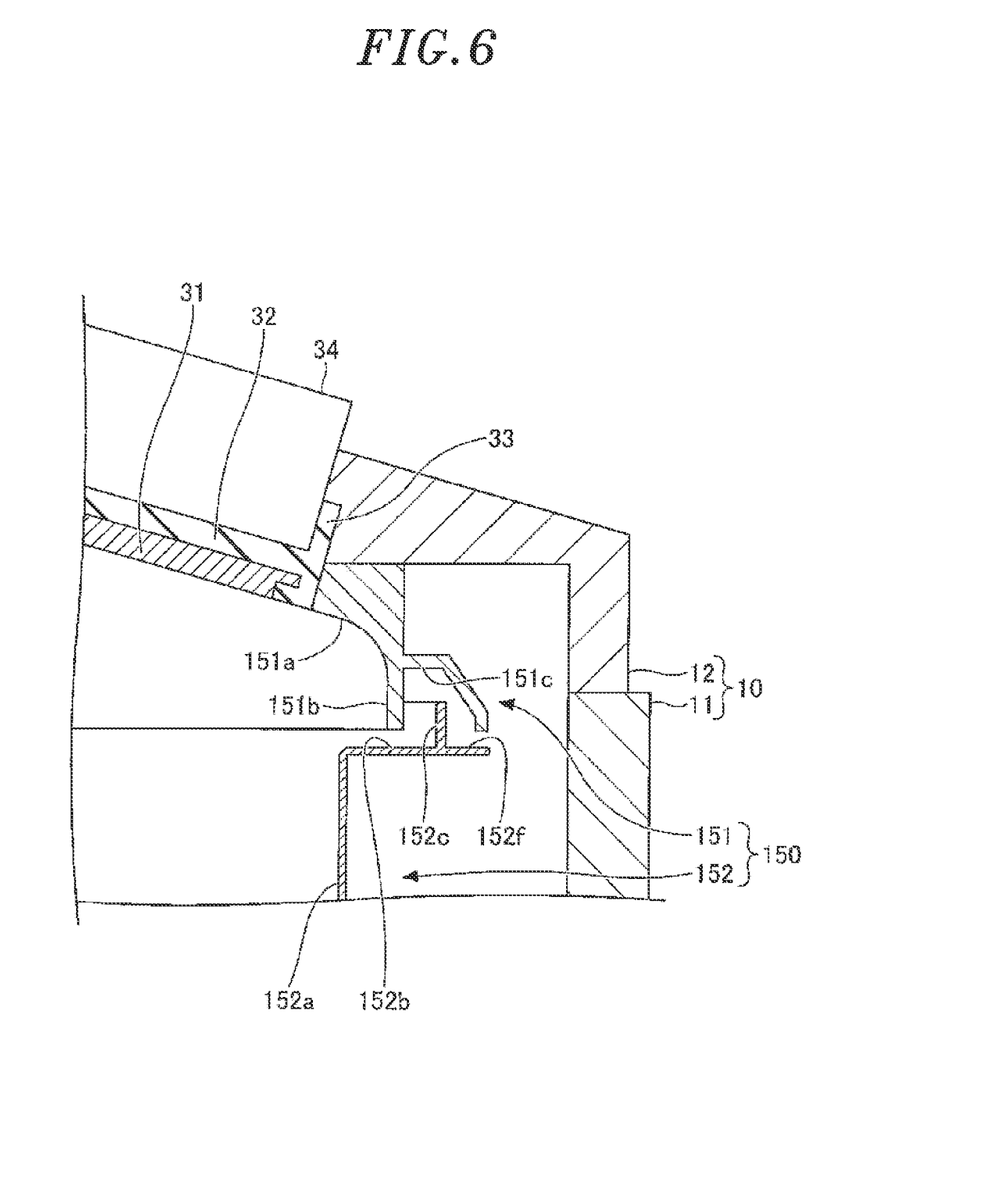
FIG. 6 is an example of a partially enlarged cross-sectional view of another film forming apparatus.
Figure 7:
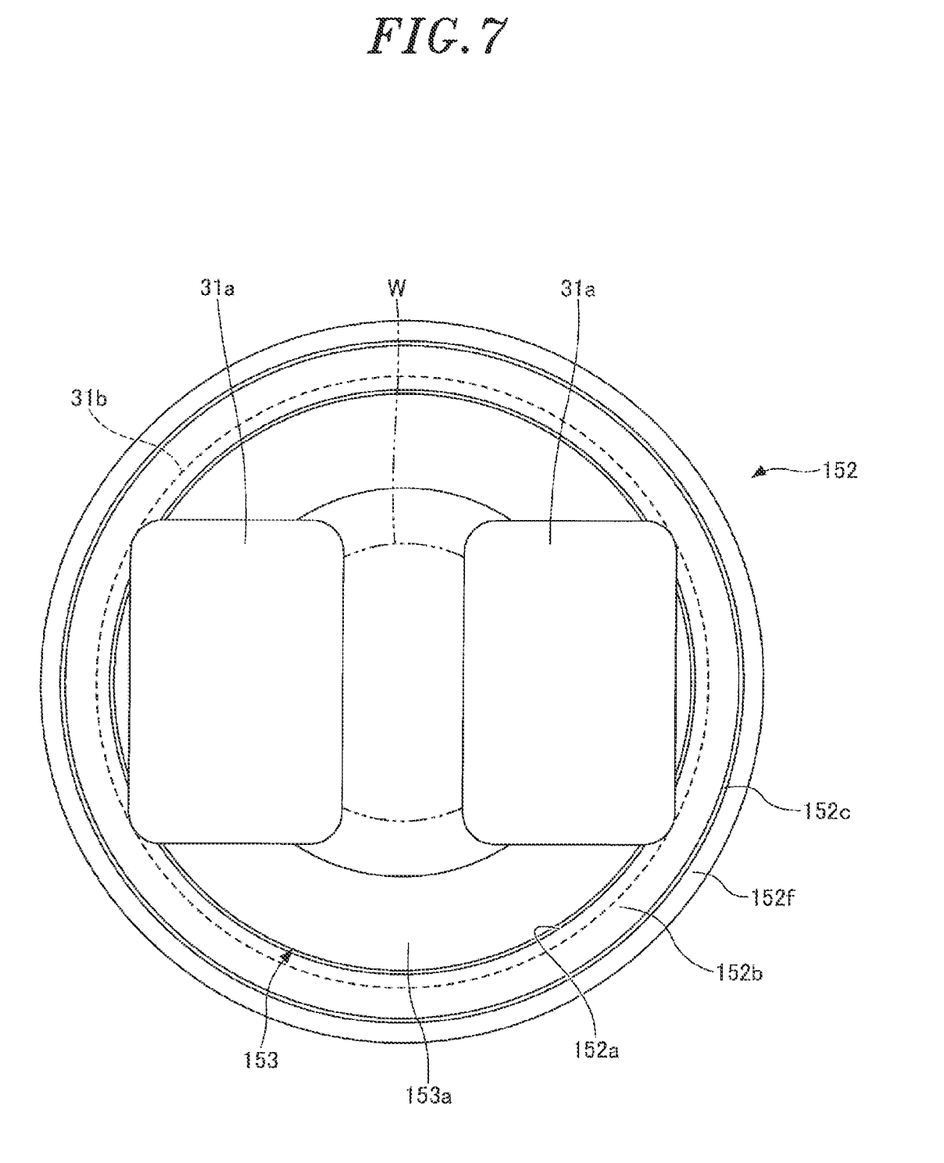
FIG. 7 is an example of a plan view showing the positional relationship between a sputtered particle emitting surface of a target and a chamber shield in another film forming apparatus.
Figure 8:
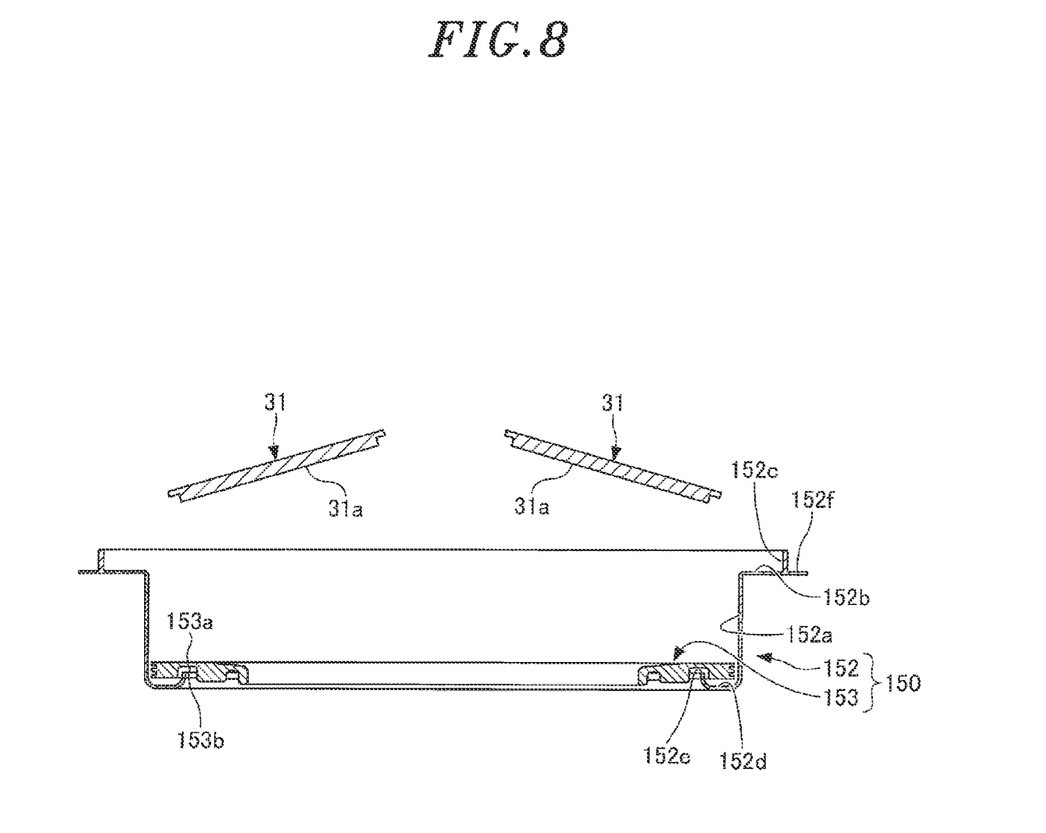
FIG. 8 is an example of a cross-sectional view showing the positional relationship of the target, the chamber shield, and a mask shield in another film forming apparatus.

Here, another shield structure in another film forming apparatus will be described with reference to FIGS. 6 to 8. FIG. 6 is an example of a partially enlarged cross-sectional view of another film forming apparatus. FIG. 7 is an example of a plan view showing the positional relationship between the sputtered particle emitting surface 31a of the target 31 and the chamber shield 152 in another film forming apparatus. FIG. 8 is an example of a cross-sectional view showing the positional relationship of the target 31, the chamber shield 152, and the mask shield 153 in another film forming apparatus.

Another film forming apparatus shown in FIGS. 6 to 8 is different from the film forming apparatus 1 shown in FIGS. 1 to 5 in the shield structure. Since the other structures are the same, the redundant description will be omitted. A shield 150 of another film forming apparatus includes a target shield 151, a chamber shield 152, and a mask shield 153.

As shown in FIG. 6, the chamber shield 152 has a cylindrical sidewall 152a, a horizontal wall 152b, a raised portion 152c, and an outer horizontal wall 152f.

The cylindrical sidewall 152a is formed in a cylindrical shape having a central axis perpendicular to the substrate supporting surface of the stage 21. The inner peripheral surface of the cylindrical sidewall 152a is perpendicular to the substrate supporting surface of the stage 21. In other words, the inner peripheral surface of the cylindrical sidewall 152a is substantially perpendicular to the target 31 disposed to face the substrate supporting surface of the stage 21. Further, the cylindrical sidewall 152a defines the side surface of the processing space. The diameter of the inner peripheral surface of the cylindrical sidewall 152a is greater than the diameter of the outer peripheral surface of the mask shield 153.

The horizontal wall 152b is formed in an annular shape horizontally extending radially outward from the upper side of the cylindrical sidewall 152a. The upper surface of the horizontal wall 152b is parallel to the substrate supporting surface of the stage 21. In other words, the upper surface of the horizontal wall 152b is disposed to face the target 31.

The raised portion 152c is formed in a cylindrical shape extending upward from the radially outer side of the horizontal wall 152b and having a central axis perpendicular to the substrate supporting surface of the stage 21. The outer horizontal wall 152f is formed in an annular shape horizontally extending radially outward from the lower side of the raised portion 152c.

The target shield 151 has a bottom surface portion 151a, a cylindrical portion 151b, and a groove 151c.

The bottom surface portion 151a has an opening exposing the target 31 and is formed to cover the bottom surface of the lid 12 including the periphery of the target 31.

The cylindrical portion 151b is formed in a cylindrical shape extending downward from the bottom surface portion 151a and having a central axis perpendicular to the substrate supporting surface of the stage 21. Here, the cylindrical portion 151b is disposed at an outer side of the cylindrical sidewall 152a. In other words, the diameter of the inner peripheral surface of the cylindrical portion 151b is greater than the diameter of the inner peripheral surface of the cylindrical sidewall 152a. Further, the lower end of the cylindrical portion 151b is formed at a position higher than the upper surface of the horizontal wall 152b. That is, the cylindrical portion 151b and the cylindrical sidewall 152a do not overlap in the height direction. Accordingly, at least a part of the horizontal wall 152b is exposed when viewed from the target 31.

The groove 151c is formed at a radially outer side of the cylindrical portion 151b. When the lid 12 is attached to the processing chamber main body 11, the raised portion 152c is inserted into the groove 151c. Accordingly, a labyrinth structure is formed in the gas channel formed by the gap between the target shield 51 and the chamber shield 52.

As shown in FIGS. 6 and 7, the target 31 has a sputtered particle emitting surface 31a exposed to the processing space through the opening of the bottom surface portion 151a. The sputtered particle emitting surface 31a of the target 31 is disposed at an inner side of the cylindrical portion 151b. In other words, the sputtered particle emitting surface 31a (the opening of the bottom surface portion 151a) of the target 31 is disposed at an inner side of the inner peripheral surface of the cylindrical portion 151b. That is, in plan view, the diameter of the inner peripheral surface of the cylindrical portion 151b is greater than the diameter of the circumcircle 31b of the sputtered particle emitting surface 31a of the target 31.

Here, the diameter of the circumcircle 31b of the sputtered particle emitting surface 31a of the target 31 is greater than the diameter of the inner peripheral surface of the horizontal wall 152b. Accordingly, as shown in FIG. 7, in plan view, the target 31 is disposed at a position where a part of the sputtered particle emitting surface 31a of the target 31 overlaps the horizontal wall 152b.

As shown in FIG. 8, the chamber shield 152 has a lower horizontal wall 152d and a lower raised portion 152e.

The lower horizontal wall 152d is formed in an annular shape horizontally extending radially inward from the lower side of the cylindrical sidewall 152a.

The lower raised portion 152e is formed in a cylindrical shape extending upward from the radially inner side of the horizontal wall 152b and having a center axis perpendicular to the substrate supporting surface of the stage 21.

As shown in FIG. 8, the mask shield 153 has an upper surface 153a exposed to the processing space. The lower groove 153b is formed on the lower surface side of the mask shield 153. When the stage 21 is located at the processing position, the lower raised portion 152e is inserted into the lower groove 153b. Accordingly, a labyrinth structure is formed in the gas channel formed by the gap between the chamber shield 152 and the mask shield 153 and the gap between the chamber shield 152 and the stage cover 23.

Here, when sputtered particles are emitted from the target 31 to form a film on the surface of the substrate W, the sputtered particles emitted from the target 31 are also adhered to the surface of the shield 150, thereby forming deposits.

In the film forming apparatus shown in FIGS. 6 to 8, the sputtered particles emitted from the target 31 are incident on the upper surface of the horizontal wall 152b of the chamber shield 152 that is a stationary surface and faces the target 31, so that deposits grow in a flake shape on the upper surface of the horizontal wall 152b. Particles may be generated when the flake-shaped deposits are peeled off from the wall surface.

No flake-shaped deposits were observed on the inner peripheral surface of the upright cylindrical sidewall 152a even if it is a stationary surface. Further, no flake-shaped deposits were observed on the upper surface of the rotating mask shield 153 even if it is a surface facing the target 31.

On the other hand, the film forming apparatus 1 shown in FIGS. 1 to 5 has a structure in which the horizontal wall 52b of the chamber shield 52, which is a stationary surface and faces the target 31, is hidden by the cylindrical portion 51b of the target shield 51 when viewed from the target 31. Accordingly, the incidence of the sputtered particles emitted from the target 31 on the upper surface of the horizontal wall 52b of the chamber shield 52 is suppressed. That is, the growth of deposits in a flake shape on the upper surface of the horizontal wall 52b is suppressed. Hence, the generation of particles caused by the flake-shaped deposits can be suppressed.

The sputtered particles passing through the gap between the cylindrical portion 51b and the cylindrical sidewall 52a are trapped by the trap structure portion 51c. Accordingly, the incidence of the sputtered particles reflected by the trap structure portion 51c on the upper surface of the horizontal wall 52b of the chamber shield 52 is suppressed. That is, the growth of deposits in a flake shape on the upper surface of the horizontal wall 52b is suppressed. Hence, the generation of particles caused by the flake-shaped deposits can be suppressed.

Further, as shown in FIG. 4, in plan view, the target 31 is disposed at a position where the sputtered particle emitting surface 31a of the target 31 does not overlap the horizontal wall 52b. Accordingly, the incidence of sputtered particles emitted from the target 31 on the upper surface of the horizontal wall 52b of the chamber shield 52 is suppressed. That is, the growth of deposits in a flake shape on the upper surface of the horizontal wall 52b is suppressed. Hence, the generation of particles caused by the flake-shaped deposits can be suppressed.

The present disclosure is not limited to the configuration described in the above embodiments, and may be applied to another embodiment in which other components are combined with the configuration described in the above embodiments. With respect to these points, the gist of the present disclosure can be changed without departing from the scope of the present disclosure, and can be appropriately determined depending on the application.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

The invention claimed is:

1. A film forming apparatus comprising:
a processing chamber including a processing chamber main body having an upper opening and a lid that closes the upper opening;
a stage disposed in the processing chamber and on which a substrate is placed;
a target disposed in the processing chamber to emit sputtered particles;
an exhaust port formed at a bottom portion of the processing chamber; and
a shield that defines a processing space where the sputtered particles are emitted into the processing chamber,
wherein the shield includes a chamber shield fixed to the processing chamber main body, and a target shield fixed to the lid,
the chamber shield includes a cylindrical sidewall and a horizontal wall formed extending from and at a radially outer side of the cylindrical sidewall,
the target shield includes a cylindrical portion extending toward the stage,
a diameter of an outer peripheral surface of the cylindrical portion is smaller than a diameter of an inner peripheral surface of the cylindrical sidewall, and the cylindrical portion and the cylindrical sidewall form a double pipe structure in which the cylindrical portion and the cylindrical sidewall overlap at least partially in a height direction,
a gap exists between the target shield and the chamber shield and a gas in the processing space passes through the gap between the target shield and the chamber shield to be exhausted to an outside of the processing chamber through the exhaust port, and
wherein the target shield has a sputtered particle incidence suppression structure portion formed extending from and at a radially outer side of the cylindrical portion and configured to suppress incidence of the sputtered particles on the horizontal wall, at least a part of the sputtered particle incidence suppression structure portion being disposed to face the horizontal wall.

2. The film forming apparatus of claim 1, wherein a lower end of the cylindrical portion is lower than an upper surface of the horizontal wall.

3. The film forming apparatus of claim 2, wherein the diameter of the inner peripheral surface of the cylindrical sidewall is greater than a diameter of a circumcircle that circumscribes a sputtered particle emitting surface of the target.

4. The film forming apparatus of claim 1, wherein the sputtered particle incidence suppression structure portion has an uneven structure that captures the sputtered particles passed through a gap between the cylindrical portion and the cylindrical sidewall.

5. The film forming apparatus of claim 4, wherein the chamber shield has a raised portion raised from the horizontal wall toward the target shield, and
the target shield has a groove into which the raised portion is inserted.

6. The film forming apparatus of claim 1, wherein the sputtered particle incidence suppression structure portion has an inclined surface whose normal direction is directed toward a radially inner side.

7. The film forming apparatus of claim 6, wherein the chamber shield has a raised portion raised from the horizontal wall toward the target shield, and
the target shield has a groove into which the raised portion is inserted.

* * * * *